(12) United States Patent
Annapragada

(10) Patent No.: US 6,876,063 B1
(45) Date of Patent: Apr. 5, 2005

(54) METHOD OF IMPROVING ADHESION OF CAP OXIDE TO NANOPOROUS SILICA FOR INTEGRATED CIRCUIT FABRICATION

(75) Inventor: Rao Venkateswara Annapragada, San Jose, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 236 days.

(21) Appl. No.: 09/902,056

(22) Filed: Jul. 9, 2001

Related U.S. Application Data

(62) Division of application No. 09/544,804, filed on Apr. 7, 2000, now Pat. No. 6,465,365.

(51) Int. Cl.$^7$ ............................................... H01L 23/58
(52) U.S. Cl. ...................................... 257/632; 438/778
(58) Field of Search ................................. 257/632, 637, 257/638, 642, 643, 758, 759, 760; 438/618, 622–624, 780–782, 788–790

(56) References Cited

U.S. PATENT DOCUMENTS 5,561,318 A * 10/1996 Gnade et al. ................ 257/638

FOREIGN PATENT DOCUMENTS

| EP | 0687004 A1 | 12/1995 | ......... H01L/21/768 |
| EP | 0881678 A2 | 12/1998 | ......... H01L/23/532 |
| EP | 0884401 A1 | 12/1998 | ............ C23C/16/44 |
| WO | WO 98/47177 | 10/1998 | ......... H01L/21/768 |

* cited by examiner

Primary Examiner—Kamand Cuneo
Assistant Examiner—Asok Kumar Sarkar
(74) Attorney, Agent, or Firm—Peter Zawilski

(57) ABSTRACT

A method of improving adhesion of a cap oxide to nanoporous silica for integrated circuit fabrication. In one embodiment, the method comprises several steps. The first step is to receive a wafer in a deposition chamber. Then a porous layer of material is deposited on the wafer. Next, a portion of the porous layer is densified in order to make it more compatible for adhesion to a cap layer. Finally, a cap layer is deposited onto the porous layer.

7 Claims, 4 Drawing Sheets

METHOD OF IMPROVING ADHESION OF CAP OXIDE TO NANOPOROUS SILICA FOR INTEGRATED CIRCUIT FABRICATION

This application is a division of Ser. No. 09/544,804 filed Apr. 7, 2000 now U.S. Pat. No. 6,465,365.

TECHNICAL FIELD

The field of the present invention pertains to semiconductor fabrication processes. More particularly, the present invention relates to the field of adhering a layer of cap oxide with an incompatible layer of nanoporous silica.

BACKGROUND ART

The power and usefulness of today's digital integrated circuit (IC) devices is largely attributed to the increasing levels of integration. More and more components (resistors, diodes, transistors, and the like) are continually being integrated into the underlying chip, or Integrated Circuit (IC). The starting material for typical ICs is high purity silicon. The material is grown as a single crystal and takes the shape of a solid cylinder. This crystal is then sawed (like a slice of bread) to produce wafers typically 10 to 30 cm in diameter and 250 microns thick.

The geometry of the features of the IC components are commonly defined photographically through a process known as photolithography. Very fine surface geometry can be accurately reproduced by this technique. The photolithography process is used to define component regions and build up components one layer on top of another. Complex ICs can often have many different built up layers, each layer having components, each layer having differing interconnections, and each layer stacked on top of the previous layer. The resulting topography of these complex IC's often resemble familiar terrestrial "mountain ranges," with many "hills" and "valleys" as the IC components are built up on the underlying surface of the silicon wafer.

Submicron devices, e.g. transistors smaller than 1 micron in size, are formed in the various layers that form the IC. Thousands or millions of the submicron devices can be utilized in a typical IC. However, circuits are continually becoming more complex and more capable. Hence, there is a constant need for increasing the number of components that are included on an IC. However, the size of an IC is frequently limited to a given die size on a wafer. Consequently, a constant need arises to reduce the size of devices in an IC.

As device size shrinks, the electrical Resistance-Capacitance (RC) delays and crosstalk associated with back-end metallization become more significant. At some point, a threshold between the size of the device and the amount of interference it can sustain, is crossed. After this threshold, the operation of the device is compromised. Hence, a need arises to reduce the RC sensitivity of a deep submicron device.

One conventional method that reduces RC sensitivity of a device and an IC, uses low dielectric constant materials, k, for deep submicron devices. However, low dielectric materials have material properties that are incompatible with subsequent materials deposited thereon. Additionally, the low dielectric materials have material properties that are detrimental in the Chemical Mechanical Polishing (CMP) process. Resultantly, a need arises for modifying the low dielectric material to make it more compatible with subsequent material layers and with CMP processes.

Referring now to prior art FIG. 1, a wafer with a conventional porous material layer interfaced with a conventional cap layer is shown as a side view of. Wafer 100 includes a substrate 102, a porous material 104, and a cap layer 106. Porous material 104 is deposited on top of substrate 102. And cap material is deposited on top of porous material 104. Porous material 104 is used because it has a low dielectric constant. However, a low dielectric material typically has low mechanical strength. Additionally, the porous material becomes impregnated with the CMP slurry during polishing. The slurry impregnated in porous material 104 causes other problems such as out gassing in subsequent high temperature processes and a high dielectric constant which hampers its operational ability. Thus, a cap layer, e.g. cap layer 106, is required on top of porous material 104 to make it at least marginally compatible with subsequent semiconductor fabrication operations, such as CMP. Consequently, cap layer 106 is deposited on top of porous material 104. Thus, cap layer 106 is used as a sacrificial layer for CMP planarization of the metal topography.

Besides these drawbacks, conventional porous layer 104, of prior art FIG. 1, has a top surface that is significantly rough, as indicated by peaks 108b. Because of the porosity and the rough and irregular top surface of porous layer 104, cap layer 106 has very poor adhesion to porous layer 104. Consequently, a need arises for a method and an apparatus that provides a smoother and less porous surface for the porous layer so as to improve the adhesion between the porous layer and the cap layer.

Because of the poor adhesion, cap layer 106 frequently delaminates during the CMP operation. Delamination of cap layer 106 from porous layer 104 occurs in damascene processing as well as during copper and aluminum CMP processing. Consequently, a need arises for a resilient interface between the porous layer and the cap layer such that CMP operations can be performed without delamination.

In summary, a constant need arises to reduce the size of devices in an IC and to reduce the RC sensitivity of a deep submicron device. Additionally, a need arises for modifying the low dielectric material to make it more compatible with subsequent material layers and with CMP processes. Furthermore, a need arises for a method and an apparatus that provides a smoother and less porous surface for the porous layer so as to improve the adhesion between the porous layer and the cap layer. Yet another need arises for a resilient interface between the porous layer and the cap layer such that CMP operations can be performed without delamination.

DISCLOSURE OF THE INVENTION

The present invention provides a method to reduce the size of devices in an IC and to reduce the RC sensitivity of a deep submicron device. Additionally the present invention provides a method for modifying a low dielectric material to make it more compatible with subsequent material layers and with CMP processes. The present invention also provides a method for making, and an apparatus having, a smoother and less porous surface for the porous layer so as to improve the adhesion between the porous layer and the cap layer. And the present invention provides a resilient interface between the porous layer and the cap layer such that CMP operations can be performed without delamination.

Specifically, one embodiment of the present invention provides a method of improving adhesion of a cap oxide to a nanoporous silica, for integrated circuit fabrication. In the present embodiment, the method comprises several steps. The first step is to receive a wafer in a deposition chamber.

Then a porous layer of material is deposited on the wafer. Next, a portion of the porous layer is densified in order to make it more compatible for adhesion to a cap layer. The step of densification is performed by exposing the top surface of the porous layer to a high density plasma. The high density plasma is a stream of high density Argon (Ar) ions, directed toward the wafer. Beneficially, ion bombardment using high density Ar ions has a self-limiting property that prevents densification from occurring beyond a certain depth in the porous layer. Finally, a cap layer is deposited onto the porous layer.

Another embodiment of the present invention implements the method of improving adhesion between a porous layer and a cap layer on a wafer by using a processor and memory. The steps provided in the previous paragraph are implemented as data and instructions of the memory to be executed by the processor.

These and other advantages of the present invention will no doubt become obvious to those of ordinary skill in the art after having read the following detailed description of the preferred embodiments which are illustrated in the drawing figures.

BRIEF DESCRIPTION OF THE DRAWINGS

The accompanying drawings, which are incorporated in, and form a part of, this specification, illustrate embodiments of the invention and, together with the description, serve to explain the principles of the invention.

PRIOR ART

Figure 1:
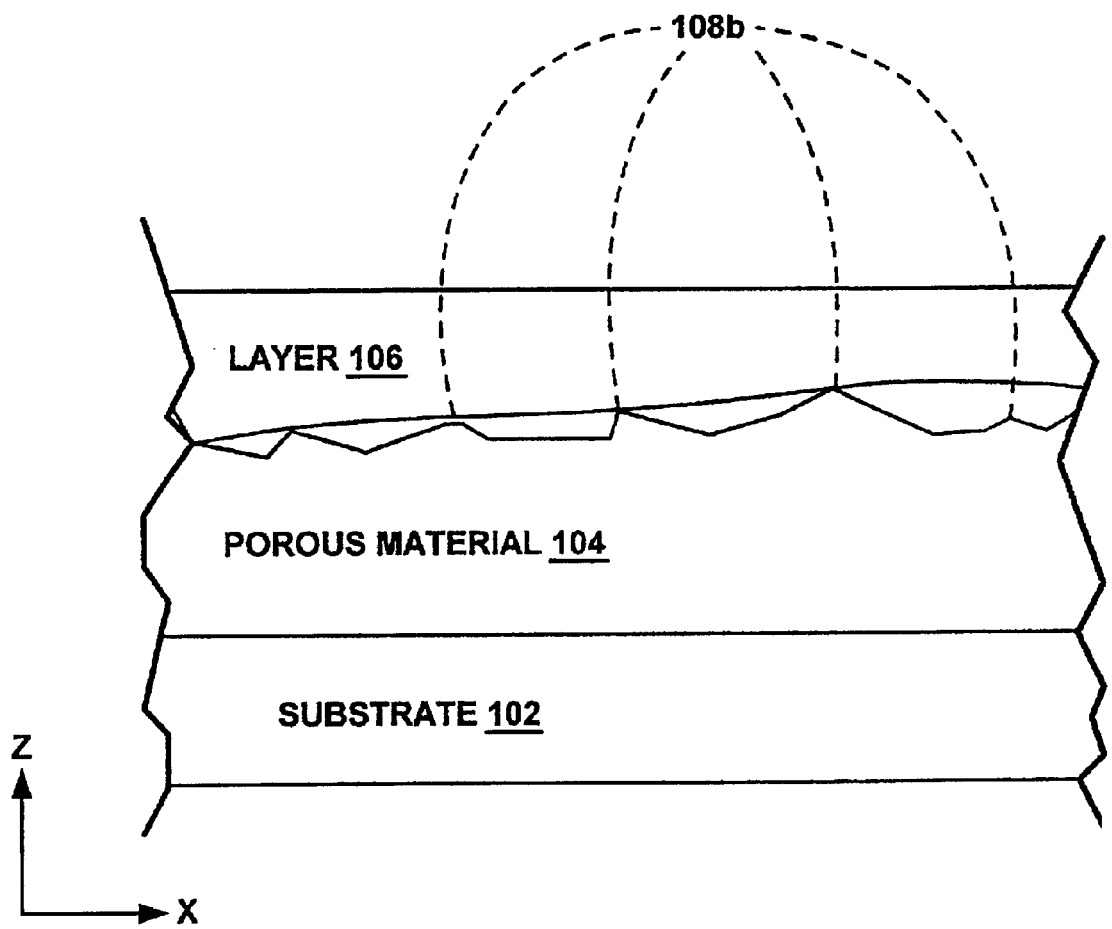
FIG. 1 is a side view of a wafer with a conventional porous material layer interfaced with a conventional cap layer.

The drawings referred to in this description should be understood as not being drawn to scale except if specifically noted.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Some portions of the detailed descriptions which follow, e.g. the processes, are presented in terms of procedures, logic blocks, processing, and other symbolic representations of operations on data bits within a computer or digital system memory. These descriptions and representations are the means used by those skilled in the arts to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Usually, though not necessarily, these physical manipulations take the form of electrical or magnetic signals capable of being stored, transferred, combined, compared, and otherwise manipulated in a processor. For reasons of convenience, and with reference to common usage, these signals are referred to as bits, values, elements, symbols, characters, terms, numbers, or the like with reference to the present invention.

It should be borne in mind, however, that all of these terms are to be interpreted as referencing physical manipulations and quantities and are merely convenient labels to be interpreted further in view of terms commonly used in the art. Unless specifically stated otherwise as apparent from the following discussions, it is understood that throughout discussions of the present invention, terms such as "receiving," "depositing," "densifying," "self-limiting," or the like, refer to the action and processes that can be implemented by an electronic computing device, that manipulates and transforms data. The data is represented as physical (electronic) quantities within the registers and memories of the device, and is transformed into other data similarly represented as physical quantities within the device components, or computer system memories or registers, or other such information storage, transmission or display devices.

Figure 2:
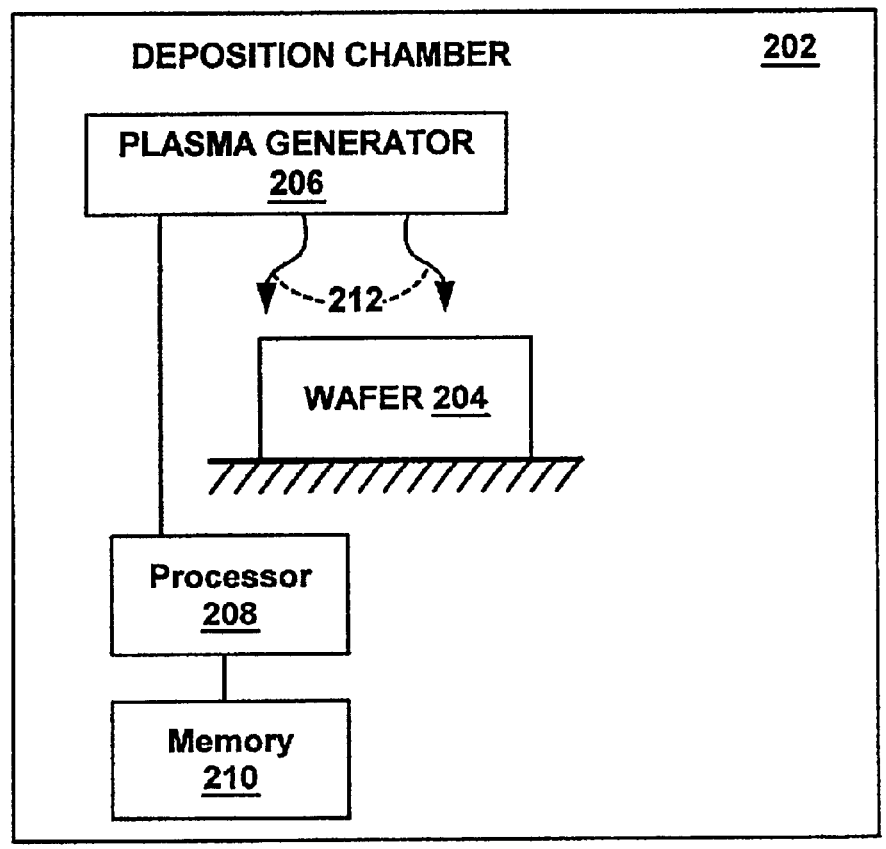
FIG. 2 is a block diagram of a deposition chamber, in accordance with one embodiment of the present invention.

Referring now to FIG. 2, a block diagram of a deposition chamber is shown, in accordance with one embodiment of the present invention. Deposition chamber 202 includes a plasma generator 206, a processor 208, and a memory 210. The deposition chamber is adapted to accept, and securely retain, a wafer 204 therein, for deposition and densification operations. Processor 208 is coupled to memory 210 and to plasma generator 206. Memory 210 is capable of storing data and instructions that can be executed by processor 208. Processor 208 instructs other devices coupled to it, such as plasma generator 206, to perform the appropriate instructions with the appropriate data, as supplied by memory 210.

Plasma generator 206 of FIG. 2 is an Argon (Ar) gas ion generator. However, the present invention is well-suited to using alternative plasma generators that, in turn, use elements other than Ar. As shown in FIG. 2, plasma generator 206 is adapted to provide Ar ions 212 to wafer 204.

Memory 210 used in deposition chamber 202, for the present invention, can either be permanent memory, such as read only memory (ROM), or temporary memory such as random access memory (RAM). Memory 210 can also be any other type of memory storage, capable of containing program instructions, such as a hard drive, a CD ROM, or flash memory. Furthermore, processor 208 can either be a dedicated controller, an existing system processor, a microprocessor, or some form of a state machine.

Figure 3:
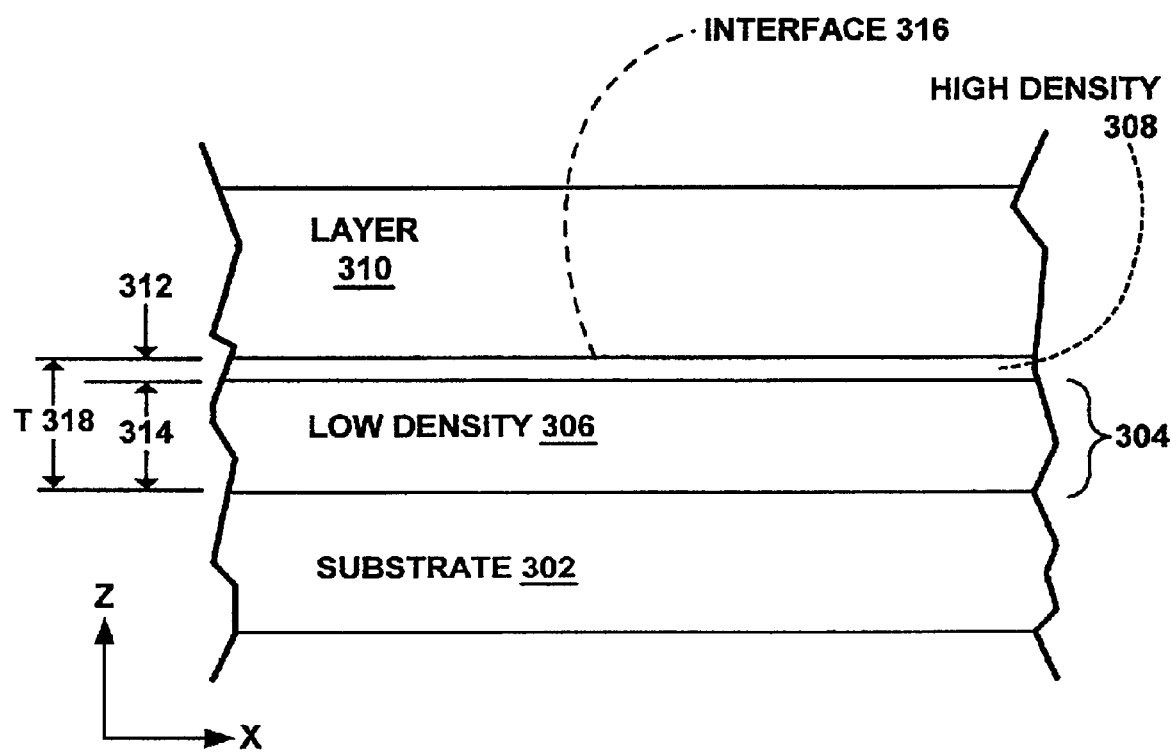
FIG. 3 is a side view of a modified porous material layer interfaced with a cap layer on a wafer, in accordance with one embodiment of the present invention.

Referring now to FIG. 3, a modified porous material layer interfaced with a cap layer on a wafer is shown as a side view, in accordance with one embodiment of the present invention. Wafer 204 includes a substrate 302, a porous material layer 304, and a cap layer 310. Porous material layer 304, in turn, includes a low density portion 306 and a high density portion 308 that is located above low density portion 306. High density portion 308 is also referred to as an upper portion of porous material layer 304. Low density portion 306 of porous material layer 304 has a thickness of 314, while high density portion 308 has a thickness of 312. The two thickness, 312 and 314, combine to equal the total thickness T 318 of the porous material layer 304.

Porous material layer 304 of FIG. 3 is, in one embodiment, a highly porous material such as silicon dioxide. One specific embodiment of such a material is nanoglass. However, the present invention is well-suited to a wide variety of low porosity materials. Additionally, cap layer 310 is an oxide material in the present embodiment. In a more specific embodiment, cap layer 310 is a Plasma Enhanced Chemical Vapor Deposition (PECVD) oxide. However, the present invention is well-suited to alternative materials for cap layer. Finally, high density portion 308 of porous material layer 304 bears the effects of Argon (Ar) gas ion bombardment, used to increase its density from the low density property of the parent porous material layer 304 to the higher density.

In FIG. 3, high density portion 308 of porous material 304 essentially provides an interface layer whereby porous material layer 304 can adequately adhere to cap layer 310. That is, the high density property of high density portion 308 of porous material 304 essentially provides an interface that has more similar mechanical properties to cap layer 310, e.g. in terms of density and porosity levels, than that offered in the prior art. Consequently, the present invention provides a beneficial apparatus, having a highly porous layer, and a desirable dielectric constant, that can be used in harmony with the less porous cap layer.

Additionally, as shown in FIG. 3, high density portion 308 of porous material layer 304 of the present invention has a smooth top surface interface 316 with cap layer 310. The smooth top surface interface 316 provides more surface area for bonding with cap layer 310. Consequently, the present invention provides another beneficial adhesion characteristics that improves the adhesion between porous material layer 304 and cap layer 310.

While specific embodiments are described for FIG. 3, the present invention is well-suited to using alternative embodiments. For example, cap oxide layer 310 is not required in one embodiment because high density portion 308 of porous material layer 304 is suitable for bonding to subsequent layers of material. Additionally, thickness 312 of high density portion 308 of porous material layer 304 is suitable to a wide range of values. For example, thickness 312 can range from a superficial surface treatment to one that extends substantially through total thickness T 318 of porous material layer 304. Similarly, thickness 314 of low density portion 306 of porous material layer 304 is suitable to a wide range of values, that complement thickness 312 such that their sum equals total thickness T 318 of porous material layer 304.

Figure 4:
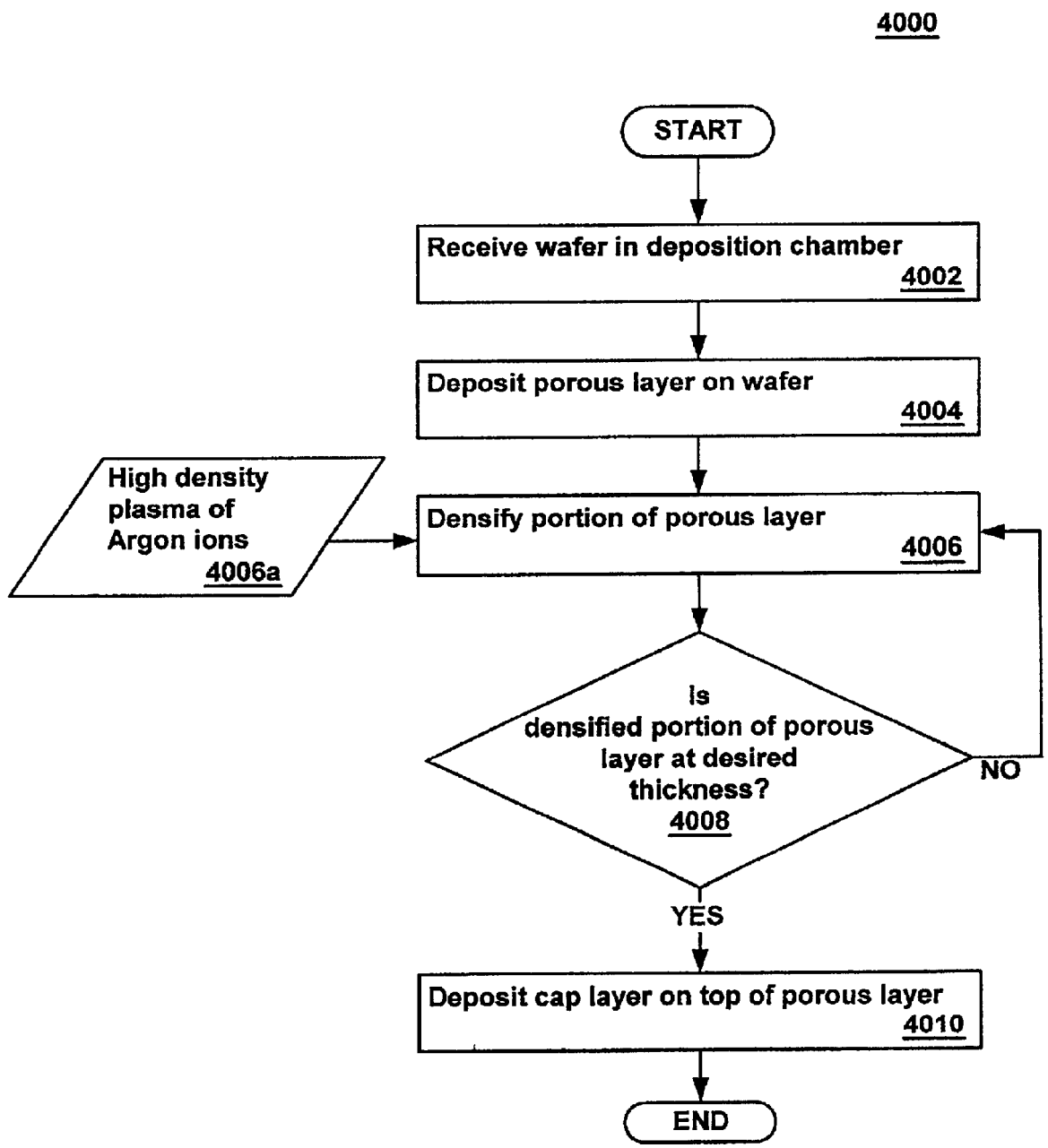
FIG. 4 is a flowchart of the steps performed to obtain improved adhesion of a cap layer to a porous layer on a wafer, in accordance with one embodiment of the present invention.

Referring now to FIG. 4, a flowchart of the steps performed to obtain improved adhesion of a cap layer to a porous layer on a wafer is shown, in accordance with one embodiment of the present invention. By using the flowchart 4000 embodiment of the present invention, more robust adhesion between porous layer and cap layer is obtained. Collateral benefits of the improved adhesion include reduced delamination during damascene processing and during CMP operations. While the present embodiment implements flowchart 4000 in a deposition chamber, the present invention can be implemented in other types of devices.

Flowchart 4000 begins with step 4002. In step 4002 of the present embodiment, a wafer is received in the deposition chamber. Step 4002 is implemented, in one embodiment, by the deposition chamber shown in FIG. 2. Specifically, deposition chamber 202 can receive wafer 204 in an appropriate stage, not shown, that will securely retain wafer 204. Wafer 204 can be of the configuration shown in FIG. 3, having only a wafer substrate 302 at this point in the chronology of flowchart 4000. Alternatively, the present invention is well-suited to receiving a wafer with the porous layer already deposited on the substrate of the wafer. Following step 4002, flowchart 4000 proceeds to step 4004.

In step 4004 of the present embodiment, a porous layer is deposited on the wafer. Step 4004 is implemented, in one embodiment, by the deposition chamber device 202 shown in FIG. 2. The detailed steps used to accomplish deposition of a porous layer on a wafer, such as evacuation of the deposition chamber or such as spin coating in a spin-coater device, are well known in the art and are not described here for purposes of clarity. FIG. 3 shows one embodiment of the product formed by step 4004. Specifically, porous layer 304 is deposited on wafer 204 to a total thickness T 318. The present invention is well-suited to having thickness T 318 being a wide range of values. In one embodiment, the porous layer is comprised of a highly porous material, such as silicon dioxide. A more specific embodiment uses nanoglass for the porous layer. However, the present invention is well-suited to a wide range of materials for the porous layer. The highly porous material offers a low dielectric constant for deep sub micron devices. Following step 4004, flowchart 4000 proceeds to step 4006.

In step 4006 of the present embodiment, a portion of the porous material layer is densified. Step 4006 is implemented, in one embodiment, by the deposition chamber device 202 shown in FIG. 2. In FIG. 2, plasma generator 206 is adapted to provide a plasma field 212 on wafer 204. In one embodiment, plasma field is an ion bombardment of high density Argon (Ar) ions, as represented by input 4006a of flowchart 4000. However, the present invention is well-suited to using a wide variety of elements and methods for densification. FIG. 3 shows one embodiment of the product formed by step 4006. Specifically, high density portion 308 of porous material layer 304 is formed as a result of the densification step. Following step 4006, flowchart 4000 proceeds to step 4008.

In step 4008 of the present embodiment, an inquiry determines whether the densified portion of the porous layer is at the desired thickness. In one embodiment, the densified portion of the porous layer is referred to as the high density portion 308 of the porous material layer 304. Thickness 312 of high density portion 308 is capable of being a wide range of values for the present invention. For example, thickness 312 can range from a superficial surface treatment to one that extends substantially through the total thickness of porous material layer 304.

In one embodiment for step 4008, as the high density portion 308 of the porous material layer 304 is formed, it acts as a filter that blocks the plasma field, e.g. the high density argon ions, from reaching the low density portion 306 of porous material layer 304 located beneath it. Hence, in one embodiment, the thickness of the high density portion 308 of the porous material layer 304 is self-regulating. However, the present invention is well-suited to alternative methods of determining when the densification step is complete. For example, the plasma operation may occur over a set period of time, or over a period of theoretically-calculated plasma energy delivered to the wafer. If the densified portion of the porous material layer is at the desired thickness, then flowchart 400 proceeds to step 4010. However, if the densified portion of the porous material layer is not at the desired thickness, then flowchart 4000 returns to step 4006.

In step 4010 of the present embodiment, a cap layer is deposited on top of the porous material layer. Step 4010 is implemented, in one embodiment, by the deposition chamber device 202 shown in FIG. 2. Alternatively, a different Chemical Vapor Deposition (CVD) chamber may be used to perform step 4010. For example, a High Density Plasma (HDP) CVD may be used to perform step 4010, especially if the cap layer is a HDP oxide. The components of a CVD chamber used to create a cap layer are well-known in the art, and are omitted herein for clarity. Step 4010 is implemented, in one embodiment to create the product shown in FIG. 3. In FIG. 3, cap layer 310 is formed by step 4010. The present invention is well-suited to a wide range of materials and thickness for cap layer 310. For example, cap layer 310 can be an oxide in one embodiment. In another embodiment, cap layer 310 can be a High Density Plasma (HDP) oxide layer. Following step 4010, flowchart 4000 ends.

While flowchart 4000 of the present embodiment shows a specific sequence and quantity of steps, the present invention is suitable to alternative embodiments. For example, not all the steps provided for flowchart 4000 are required for the present invention. For example, an alternative embodiment of flowchart 4000 can omit step 4010 if a cap layer is not desired. Furthermore, additional steps may be added to the steps presented in the present embodiment. Likewise, the sequence of the steps can be modified depending upon the application. While flowchart 4000 is shown as a single serial process, it can also be implemented as a continuous or parallel process.

Many of the instructions for the steps, and the data input and output from the steps of flowchart 4000 are implemented utilizing memory 210 and processor 208, as shown in FIG. 2. The memory storage 210 of the present embodiment can either be permanent, such as read only memory (ROM), or temporary memory such as random access memory (RAM). Memory 210 can also be any other type of memory storage, capable of containing program instructions, such as a hard drive, a CD ROM, or flash memory. Furthermore, processor 208 can either be a dedicated controller, an existing system processor, or it can be a dedicated digital signal processing (DSP) processor. Alternatively, the instructions may be implemented using some form of a state machine.

In view of the embodiments presented herein, the present invention provides a method to reduce the size of devices in an IC and to reduce the RC sensitivity of a deep submicron device. Additionally, the present invention provides a method for modifying a low dielectric material to make it more compatible with subsequent material layers and with CMP processes. The present invention also provides a method for making, and an apparatus having, a smoother and less porous surface for the porous layer so as to improve the adhesion between the porous layer and the cap layer. And the present invention provides a resilient interface between the porous layer and the cap layer such that CMP operations can be performed without delamination.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A wafer, comprising:

a substrate;

a porous layer comprised of a nanoporous material deposited with a dry process on the substrate, the porous layer including a low density portion closer to the substrate than a high density portion, the high density portion being a densified form of the low density portion, wherein the porous layer has a continuous range of density that decreases as the porous layer tends closer to the substrate; and a cap layer deposited with a dry process on the porous layer in contact with the high density portion, the cap layer including an oxide-based material.

2. The wafer of claim 1, wherein the cap layer includes a Plasma Enhanced Chemical Vapor Deposition (PECVD) oxide layer.

3. A device, comprising:

a wafer including a substrate; and a layer of a nanoporous material deposited with a dry process on the substrate, the layer including a low density portion closer to the substrate than a high density portion, the high density portion being a densified form of the low density portion, wherein the nanoporous layer has a continuous range of density that decreases as the nanoporous layer tends closer to the substrate.

4. The device of claim 3, further comprising a cap layer deposited on the high density portion, the cap layer including an oxide-based material.

5. The device of claim 4, wherein the cap layer includes a Plasma Enhanced Chemical Vapor Deposition (PECVD) oxide layer.

6. The device of claim 3, wherein the low density portion of the layer is in contact with the substrate.

7. The device of claim 3, wherein the layer is comprised of silicon dioxide.

* * * * *